(12) United States Patent
Tonge

(10) Patent No.: US 7,821,245 B2
(45) Date of Patent: Oct. 26, 2010

(54) VOLTAGE TRANSFORMATION CIRCUIT

(75) Inventor: Peter James Tonge, Newbury (GB)

(73) Assignee: Analog Devices, Inc., Norwood, MA (US)

( * ) Notice: Subject to any disclaimer, the term of this patent is extended or adjusted under 35 U.S.C. 154(b) by 383 days.

(21) Appl. No.: 11/890,362

(22) Filed: Aug. 6, 2007

(65) Prior Publication Data

US 2009/0039862 A1 Feb. 12, 2009

(51) Int. Cl.
  *G05F 3/04* (2006.01)
  *G05F 3/16* (2006.01)
(52) U.S. Cl. .................. 323/314; 323/315; 323/316
(58) Field of Classification Search .................. 323/314, 323/315, 316
See application file for complete search history.

(56) References Cited

U.S. PATENT DOCUMENTS

| | | | | |
|---|---|---|---|---|
| 4,087,758 A * | 5/1978 | Hareyama | .................... | 323/314 |
| 4,578,632 A * | 3/1986 | Laughton | .................... | 323/315 |
| 4,795,961 A * | 1/1989 | Neidorff | .................... | 323/314 |
| 5,892,355 A | 4/1999 | Pansier et al. | | |
| 6,501,256 B1 * | 12/2002 | Jaussi et al. | .................. | 323/315 |
| 6,529,066 B1 * | 3/2003 | Guenot et al. | ................ | 327/539 |
| 6,559,711 B2 * | 5/2003 | Widdershoven et al. | ...... | 327/538 |
| 6,587,000 B2 * | 7/2003 | Oikawa | ...................... | 330/288 |
| 6,590,372 B1 * | 7/2003 | Wiles, Jr. | ..................... | 323/316 |
| 7,019,584 B2 * | 3/2006 | Bartel et al. | ................. | 327/539 |
| 7,427,854 B2 * | 9/2008 | Redoute et al. | ............. | 323/316 |
| 2006/0091875 A1 * | 5/2006 | Kimura | ...................... | 323/315 |
| 2007/0176590 A1 | 8/2007 | Kimura | | |

FOREIGN PATENT DOCUMENTS

| EP | 1557679 | 7/2005 |
|---|---|---|
| GB | 2159286 | 11/1985 |

OTHER PUBLICATIONS

PCT/US2008/009332, International Search Report and written opinion, Dec. 5, 2008.

* cited by examiner

*Primary Examiner*—Bao Q Vu
(74) *Attorney, Agent, or Firm*—Kenyon & Kenyon LLP

(57) ABSTRACT

A voltage transformation circuit comprising a first input, a second input, a first output, first and second impedances and a current mirror having master and slave terminals, wherein the first impedance is connected between the first input and the master terminal of the current mirror, the second impedance is connected between the second input and the slave terminal of the current mirror, and the first output is connected to the slave terminal of the current mirror.

20 Claims, 3 Drawing Sheets

US 7,821,245 B2

VOLTAGE TRANSFORMATION CIRCUIT

FIELD OF THE INVENTION

The present invention relates to a voltage transformation circuit. Such a circuit is particularly useful for removing a common mode component from two voltage measurements such that the difference between these measurements can be more easily determined.

BACKGROUND OF THE INVENTION

It is often desirable to be able to make two measurements and to remove the common mode component of those measurements to look at a difference between the measurements. By way of example, consider a relatively high voltage supply line providing power to a load. It may be desirable to measure the current provided to the load, and this can be done by inserting a low value sense resistor, $R_{sense}$, in series with the load. The voltage at the supply side of the resistor will be the supply voltage $V_{HT}$ whereas the voltage on the load side of the sensing resistor will be $V_{HT} - (R_{sense} \times I_{HT})$ where $I_{HT}$ represents the current flowing through the resistor. $V_{HT}$ may be many tens or hundreds of volts while the voltage dropped across the sensing resistor $R_{sense}$ may only be in the region of millivolts.

It is often desirable to amplify the voltage drop across the sensing resistor $R_{sense}$ and then provide this to other circuits where this value can be displayed or used. However the amplifiers and subsequent components often work at relatively low voltages, for example five or less volts, referenced to a ground potential. The semiconductor process used to form these components is often unsuitable for high voltages and frequently incapable of withstanding them without damage.

It is known that the voltages occurring across the sense resistor $R_{sense}$ could be attenuated by resistor potential dividers such that the voltage at the output of the potential divider is suitable for provision to an amplifier or other signal processing circuitry using relatively low voltage transistors. However the potential divider attenuates the common mode voltage and the differential voltage equally and the resistors used in the potential divider act as noise sources.

SUMMARY OF THE INVENTION

According to the present invention there is provided a voltage transformation circuit comprising a first input, a second input, a first output, first and second impedances and a current mirror having master and slave terminals, wherein the first impedance is connected between the first input and the master terminal of the current mirror, the second impedance is connected between the second input and the slave terminal of the current mirror, and the first output is connected to the slave terminal of the current mirror.

It is thus possible when faced with first and second signals having a common mode component which is common to both the first and second signals and a differential mode component which represents a difference between the first and second signals to use the action of the current mirror to remove the common mode component without attenuating the differential component.

The output may operate in a current mode manner, such that the magnitude and direction of current flow at the output directly represents the difference between the signals supplied to the first and second inputs of the voltage transformation circuit. However a current to voltage conversion circuit may be attached to the first output in order to provide a voltage output representative of the voltage difference between the first and second inputs.

Advantageously the voltage transformation circuit has a second output connected to the master terminal of the current mirror. The voltages at the first and second outputs may then be provided to an operational amplifier which may be configured to simply amplify the voltage difference, or may be configured to perform other functions, such as integration.

The current mirror may be implemented by any suitable technology in which the current flowing at a first terminal thereof which represents a master terminal is used to force the current flowing at a second terminal thereof, which represents a slave terminal, to match that flowing at the master terminal. Current mirror circuits are well known and can be implemented using field effect transistors or bipolar transistors.

BRIEF DESCRIPTION OF THE DRAWINGS

The present invention will further be described, by way of non-limiting example, with reference to the accompanying Figures, in which.

DESCRIPTION OF PREFERRED EMBODIMENTS OF THE PRESENT INVENTION

Figure 1:
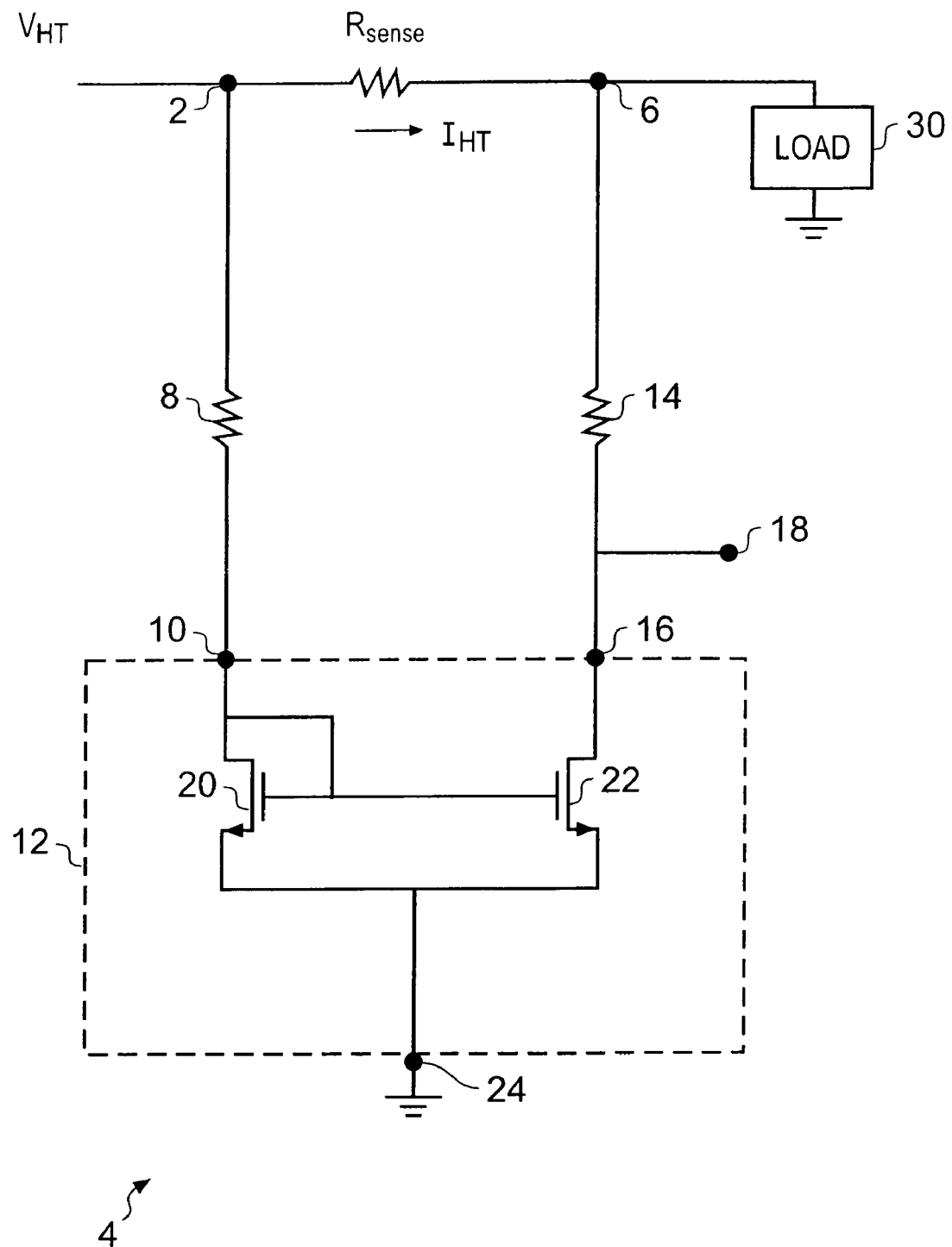
FIG. 1 schematically illustrates a voltage transformation circuit constituting a first embodiment of the present invention.

FIG. 1 is a circuit diagram of a first embodiment of the present invention used in conjunction with a current sensing resistor $R_{sense}$ in order to measure the voltage on a supply line $V_{HT}$ where the voltage on the supply line is too great to be directly connected to a measuring circuit. It is known that the voltage dropped across the resistor $R_{sense}$ is directly proportional to the current $I_{HT}$ flowing through the resistor. In order to measure the voltage dropped across the sensing resistor $R_{sense}$ a first input 2 of the voltage transformation circuit, generally designated 4, is connected to a first terminal of the resistor $R_{sense}$ whereas a second input 6 of the voltage transformation circuit is connected to a second terminal of the resistor $R_{sense}$. A first resistor 8 extends between the first input 2 and a master input 10 of a current mirror 12. A second resistor 14 is connected between the second input 6 of the voltage transformation circuit and a slave terminal 16 of the current mirror 12. A first output terminal 18 is also connected to the slave terminal 16 of the current mirror 12.

In use the action of the current mirror is to cause the current flowing at the slave terminal 16 of the mirror 12 to track the current flowing at the master terminal 10. The current mirror comprises first and second field effect transistors 20 and 22 connected in the well known current mirror configuration. Gate terminals of the field effect transistors 20 and 22 are connected together and also to the drain of the transistor 20 which forms the master terminal of the current mirror. The drain of the second transistor 22 forms the slave terminal of the current mirror and the sources of the transistors 20 and 22 are connected together and to a common node 24 which may be connected to any arbitrary potential, but which is normally connected to a system ground potential, which in the case of devices dealing with power supplies is often an earth.

In use the transistor 20 maintains the voltage at the master terminal 10 reasonably close to that at the common node 24. Therefore, when $V_{HT}$ has a voltage of several tens or hundreds of volts the voltage drop across the first resistor 8 is substantially $V_{HT}$ (less a small drop occurring across the transistor 20) and the circuit designer can select the value of the resistor 8 to give rise to whatever current value he deems to be appropriate to flow in the current mirror. Typically this would be expected to be in the several micro-amps to several hundreds of micro-amps. Because the transistors 20 and 22 are well matched and their gates are held at the same potential and their sources are held at the same potential then transistor 22 will seek to conduct the same current as flows through transistor 20, assuming that the transistors have identical geometries. If the second resistor 14 accurately matches the value of the first resistor 8 then the current flowing through the resistor will depend upon the voltage dropped across that resistor. This voltage drop is modified by the voltage dropped across the current sensing resistor $R_{sense}$. Therefore when a load current $I_{HT}$ is supplied to a load 30 then the current flowing through the second resistor 14 will be slightly different to that flowing through the first resistor 8, however the currents flowing through the transistors 20 and 22 are identical. Therefore any current imbalance results in the current flowing out of, or alternatively into, the output node 18. The magnitude of this current is directly proportional to the voltage dropped across the sensing resistor $R_{sense}$ and the direction of the current is indicative of the direction of current flow through the sensing resistor $R_{sense}$. The current occurring at the output 18 could be supplied directly to a current mode measuring circuit.

Figure 2:
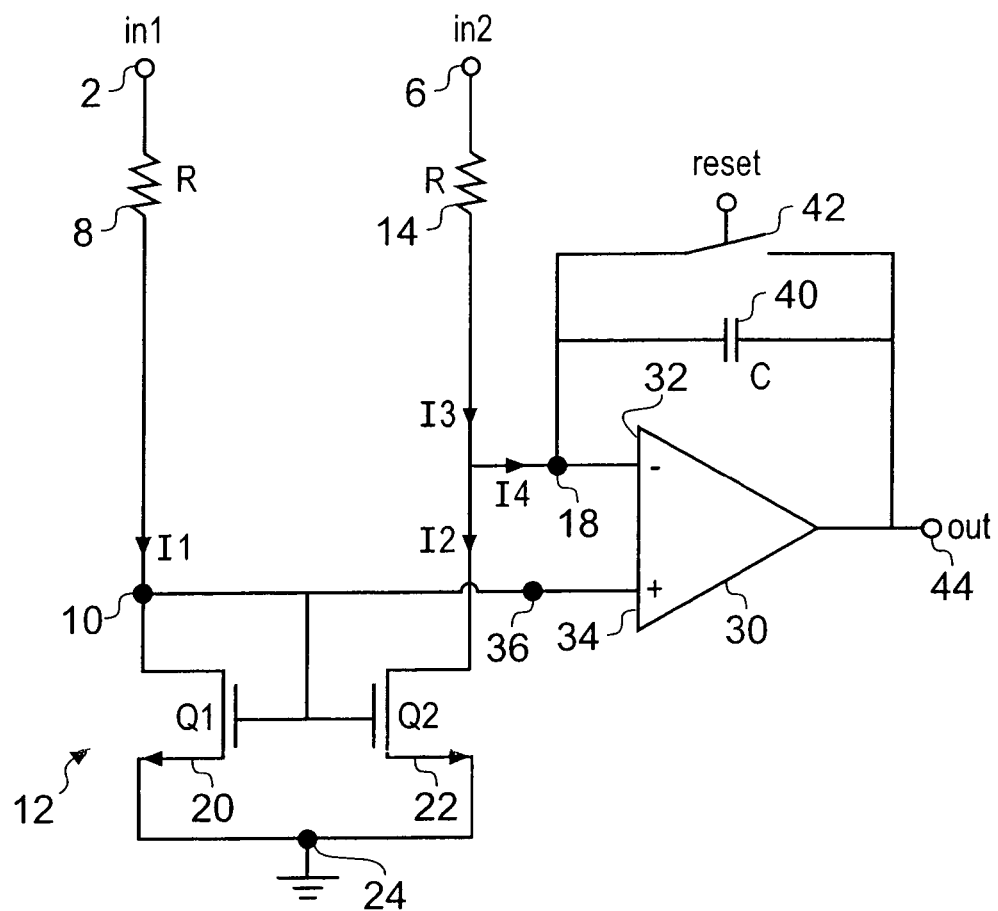
FIG. 2 schematically illustrates a voltage transformation circuit constituting a second embodiment of the present invention.

Many users prefer to have a voltage output rather than a current output. In order to achieve this, the arrangement shown in FIG. 1 may be modified, as shown in FIG. 2 to include an operational amplifier 30. As shown, an inverting input 32 of the operational amplifier 30 is connected to the first output 18. Additionally a non-inverting input 34 of the operational amplifier 30 is connected to a second output 36 which is connected to the master terminal 10 of the current mirror 12. A feedback circuit, which in this example comprises a capacitor 40 with a shorting circuit 42 is provided. In use, the amplifier 30 seeks to maintain the voltage at its inverting input 32 to be equal to that at its non-inverting input 34. Therefore the output 44 of the amplifier 30 will attain whatever voltage is necessary in order to cause the current flowing through the feedback component 40 to compensate for the current imbalance between resistors 8 and 14. As the feedback component is a capacitor, then the output of the amplifier 44 will integrate the voltage difference occurring at the first and second inputs 2 and 6, respectively such that after a suitable period of time a measurement of the voltage difference, and hence the current flowing through the sensor resistor $R_{sense}$ can be made.

In order to maintain proper operation of the circuit, at least for measurement purposes, the capacitor 40 needs to be periodically discharged via the switch 42 such that the output voltage of the amplifier does not become constrained by its supply rails.

The use of operational amplifier also has the advantage that, as mentioned hereinbefore, the amplifier seeks to keep the voltages occurring at its inputs equal to each other. This means that the drain-source voltage across transistor 22 is held equal to the drain voltage across transistor 20. This further improves the matching of the current flow in each of the transistors 20 and 22.

Figure 3:
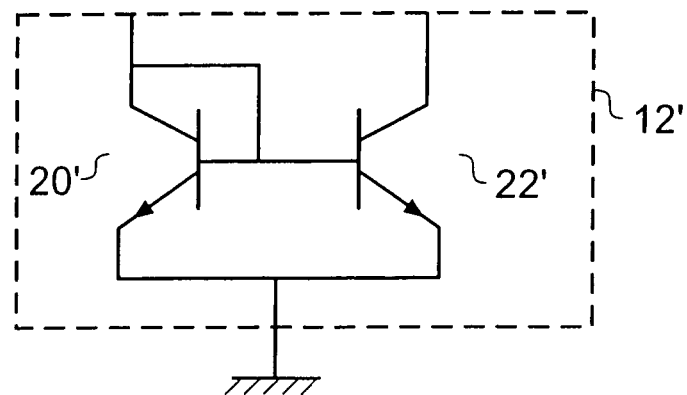
FIG. 3 schematically illustrates an alternative current mirror configuration using bipolar transistors.

As noted, the current mirror can be implemented in bipolar, and FIG. 3 schematically illustrates an alternative current mirror 12' using bipolar transistors 20' and 22' which match the action of the current mirror 12 implemented using the field effect transistors 20 and 22.

The resistors 8 and 14 may be formed within a monolithically integrated circuit along with the current mirror 12 and the amplifier 30. In which case the components can expect to be well matched, but additional trimming blocks may be provided in association with either one or both the resistors 8 and 14. Such trimming blocks, which generally include a plurality or resistors either in series or parallel with the respective resistor 8 or 14, whereby the trimming resistors can be switched into or out of conduction are well known to the person skilled in the art. Alternatively the resistors 8 and 14 may be provided as external components in which case the engineer can include additional trimming components or can pre-measure the value of resistors in order to sort the resistors into matched pairs.

Figure 4:
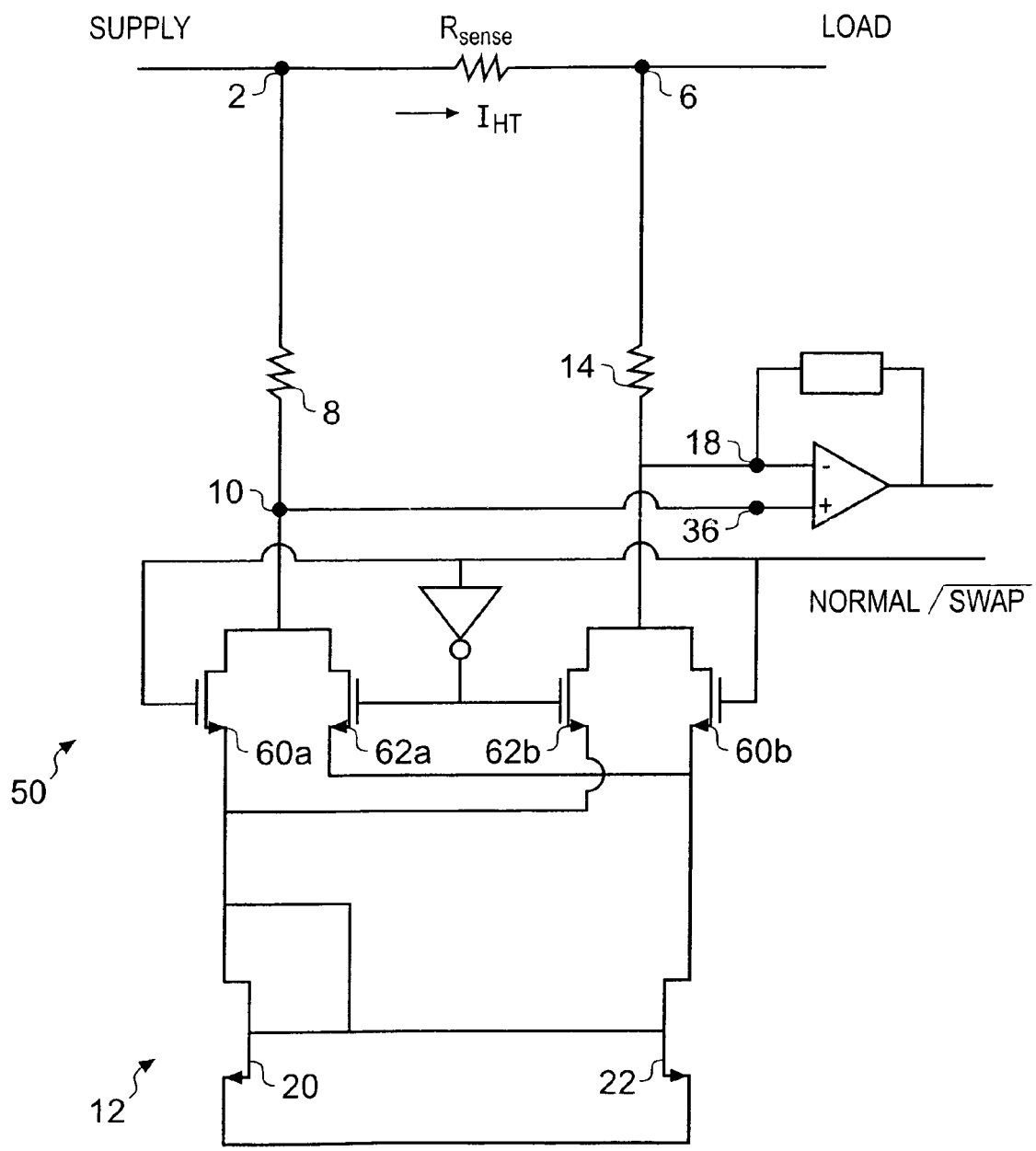
FIG. 4 illustrates a further embodiment of the present invention.

The current mirror may exhibit an offset which may be undesirable when working with very small voltage drops across the sense resistor $R_{sense}$. Whilst it can be difficult to eliminate these offsets completely it is possible to enable the offset to be measured or the difference component to be converted from a direct current signal to an alternating current signal by use of a swapping current mirror. FIG. 4 illustrates such an arrangement.

Consequently an output voltage resulting from current in the sense resistor will be reversed in polarity whereas an offset voltage is not reversed in polarity. Thus periodically operating a swap circuit 50 to swap the current flow into the current mirror over enables the desired signal to be separated from DC offsets.

The swap circuit comprises first to fourth transistors 60a, 62a, 62b and 60b. The drains of the transistors 60a and 62a are connected in series with the first resistor 8. The source of the transistor 60a is connected to the master terminal of the current mirror whereas the source of the transistor 62a is connected to the salve terminal of the current mirror. The transistor 60a is directly driven by a swap control signal "NORMAL/SWAP" whereas the transistor 62a receives an inverted version of this signal. Thus current flowing through the resistor 8 can be steered to either side of the current mirror. A similar arrangement is provided by transistors 60b and 62b to steer the current flowing through the resistor 14.

Thus operation of the swap circuit can be used to quantify offsets occurring within the voltage transformation circuit. The transistors 60a, 62a, 62b and 60b all work at a low voltage. It is advantageous for a delay to be inserted in the swap circuit to ensure that the transistors are never all off at the same time whilst the circuit is in use.

It is thus possible to provide a voltage transformation circuit which suppresses the common mode component of a voltage occurring at first and second inputs to and 6, respectively, thereof without attenuating a differential component between the input voltages.

The invention claimed is:

1. A voltage transformation circuit, comprising:
   a first input, a second input, and a sense impedance connected between the first input and the second input;
   a current mirror, including a master terminal and a slave terminal;
   a first impedance connected between the first input and the master terminal;
   a second impedance connected between the second input and the slave terminal; and a swap circuit connected to the current mirror, operative to steer current flowing through the first impedance to the master terminal of the current mirror in response to a control signal being in a first state, and to steer current flowing through the first impedance to the slave terminal of the current mirror in response to the control signal being in a second state.

2. The voltage transformation circuit of claim 1, wherein the current mirror includes a reference potential, a first transistor having a first terminal, a second terminal, and a gate terminal, and a second transistor having a first terminal, a second terminal, and a gate terminal, wherein the first terminal of the first transistor is connected to the master terminal, wherein the gate terminal of the first transistor is connected to the master terminal, wherein the second terminal of the first transistor is connected to the reference potential, wherein the first terminal of the second transistor is connected to the reference potential, wherein the gate terminal of the second transistor is connected to the master terminal, and wherein the second terminal of the second transistor is connected to the slave terminal.

3. The voltage transformation circuit of claim 1, wherein the first input is connected to a high voltage supply line.

4. The voltage transformation circuit of claim 1, wherein the second input is connected to a load.

5. The voltage transformation circuit of claim 1, wherein the current mirror includes two field effect transistors.

6. The voltage transformation circuit of claim 1, wherein the first impedance and the second impedance have substantially identical properties.

7. The voltage transformation circuit of claim 1, further comprising:
  an operational amplifier (opAmp), including:
    a non-inverting input connected to the master terminal;
    an inverting input connected to the current output;
    an opAmp output connected to the inverting input in a feedback loop; and
    a voltage output connected to the opAmp output.

8. The voltage transformation circuit of claim 7, further comprising:
  a capacitance element connected in series in the feedback loop.

9. The voltage transformation circuit of claim 7, further comprising:
  a reset element connected in parallel with the feedback loop.

10. The voltage transformation circuit of claim 1, further comprising:
  a current to voltage converter connected to the current output.

11. The voltage transformation circuit of claim 10, wherein the current to voltage converter includes an integrator.

12. The voltage transformation circuit of claim 10, wherein the sense impedance has a low impedance value greater than an impedance value of connection material.

13. A voltage transformation circuit, comprising:
  a first input, a second input, and a sense impedance connected between the first input and the second input;
  a current mirror, including a master terminal and a slave terminal;
  a swap element having a first swap connection point and a second swap connection point;
  a first impedance connected between the first input and the first swap connection point;
  a second impedance connected between the second input and the second swap connection point;
  a current output connected between the slave terminal and the second impedance, wherein the current output contains a current directly proportional to a voltage drop across the sense impedance; and
  a swap control signal input, wherein the swap element includes four transistors (S1 to S4), each of the transistors having first and second connection terminals and a gate terminal, wherein the first swap connection point is connected to the first terminals of S1 and S2, wherein the second swap connection point is connected to the first terminals of S3 and S4, wherein the second terminals of S1 and S3 are connected to the master terminal, wherein the second terminals of S2 and S4 are connected to the slave terminal, wherein the gate terminals of S1 and S4 are connected to the swap control signal input, and wherein the gate terminals of S2 and S3 are connected to an inverted swap control signal input.

14. The voltage transformation circuit of claim 13, further comprising:
  an operational amplifier (opAmp), including:
    a non-inverting input connected to the first swap connection point;
    an inverting input connected to the second swap connection point;
    an opAmp output connected to the inverting input in a feedback loop; and
    a voltage output connected to the opAmp output.

15. A voltage transformation circuit, comprising:
  first and second inputs, first and second outputs, first and second impedances, a current mirror having master and slave terminals, and a swap circuit, wherein:
  the first impedance is connected between the first input and a first input of the swap circuit;
  the second impedance is connected between the second input and a second input of the swap circuit;
  a first output of the swap circuit is connected to the master terminal of the current mirror;
  a second output of the swap circuit is connected to the slave terminal of the current mirror;
  the first output is connected to the first input of the swap circuit;
  the second output is connected to the second input of the swap circuit; and wherein, in use, the swap circuit is operative to steer current flowing through the first impedance to the master terminal of the current mirror in response to a control signal being in a first state, and to steer current flowing through the first impedance to the slave terminal of the current mirror when the control signal is a second state.

16. A voltage transformation circuit as claimed in claim 15, in which the swap circuit is operable to steer current flowing through the second impedance to the slave terminal of the current mirror in response to the control signal being in the first state, and to steer current flowing through the second impedance to the master terminal of the current mirror when the control signal is in the second state.

17. A voltage transformation circuit as claimed in claim 15, further comprising an operational amplifier having a non-inverting input, an inverting input and an amplifier output, wherein the one of the inputs of the amplifier is connected to the first output, and the other of the inputs of the amplifier is connected to the second output, and a feedback component is connected between the amplifier output and the inverting input of the amplifier.

18. A voltage transformation circuit as claimed in claim 17, in which the inverting input is connected to the first output and the non-inverting input is connected to the second output.

19. A voltage transformation circuit as claimed in claim 15, in which the current mirror comprises first and second field effect transistors, each having a drain, a source and a gate, and where the drain of the first field effect transistor is connected to the master terminal of the current mirror, the drain of the second field effect transistor is connected to the slave terminal of the current mirror, the sources of the first and second field effect transistors are connected to a common terminal, and the gates of the first and second field effect transistors are connected to the master terminal of the current mirror.

20. A voltage transformation circuit as claimed in claim 15, in which the current mirror comprises first and second bipolar transistors each having a collector, an emitter and a base, wherein the collector of the first transistor is connected to the master terminal of the current mirror, the collector of the second terminal is connected to the slave terminal of the current mirror, the emitters of the first and second transistors are connected to a common terminal, and the bases of the first and second transistors are connected to the master terminal of the current mirror.

* * * * *